United States Patent [19]
Caron et al.

[11] Patent Number: 5,347,419
[45] Date of Patent: Sep. 13, 1994

[54] CURRENT LIMITING SOLENOID DRIVER

[75] Inventors: LaVerne A. Caron; Edward F. Handley; W. Paul Kuo, all of Kalamazoo; E. James Lane, Highland, all of Mich.

[73] Assignee: Eaton Corporation, Cleveland, Ohio

[21] Appl. No.: 994,779

[22] Filed: Dec. 22, 1992

[51] Int. Cl.$^5$ .................. H03K 3/01; H03K 5/08; F02D 41/20; G05F 1/40

[52] U.S. Cl. .................. 361/154; 361/152; 361/187; 323/222; 323/282; 323/225

[58] Field of Search ........ 361/187, 194, 160, 152–159; 192/0.075, 84 R; 303/20, 95; 251/129.05; 323/282, , 222, 225

[56] References Cited

U.S. PATENT DOCUMENTS

| | | | |
|---|---|---|---|
| 4,155,112 | 5/1979 | Miller et al. | 363/21 |
| 5,028,861 | 7/1991 | Pace et al. | 323/222 |
| 5,120,143 | 6/1992 | Fujiwara et al. | 400/157.2 |
| 5,179,496 | 1/1993 | Mimura | 361/154 |
| 5,202,813 | 4/1993 | Uota et al. | 361/154 |
| 5,214,561 | 5/1993 | Morita | 361/187 |

FOREIGN PATENT DOCUMENTS

5614668  7/1979  Japan .................. F16K 31/02

*Primary Examiner*—A. D. Pellinen
*Assistant Examiner*—Aditya Krishnan
*Attorney, Agent, or Firm*—Brooks & Kushman

[57] ABSTRACT

A solenoid driver applies an actuation current to a solenoid for a predetermined period and a lower holding current thereafter. A switching device pulses the applied current within upper and lower limits to maintain the actuation and holding current amplitudes, the pulses being integrated by solenoid inductance into a substantially steady-state current. A multiprocessing unit determines the amplitudes of solenoid current. A signal representative of desired current amplitudes is compared with a signal representative of measured solenoid current, and a signal representative of the difference therebetween is used to control the switching device. Voltage developed across a resistor in series with the solenoid is input to a differential amplifier having connected to its output a peak detector that mimics the decay rate of current in the solenoid, the signal representative of measured solenoid current being obtained from the peak detector. Power dissipation by the solenoid driver is minimal, and the latter is capable of withstanding a continuous short to a source of electric current. The output of the peak detector is monitored by the microprocessing unit for the detection and logging of faults.

29 Claims, 4 Drawing Sheets

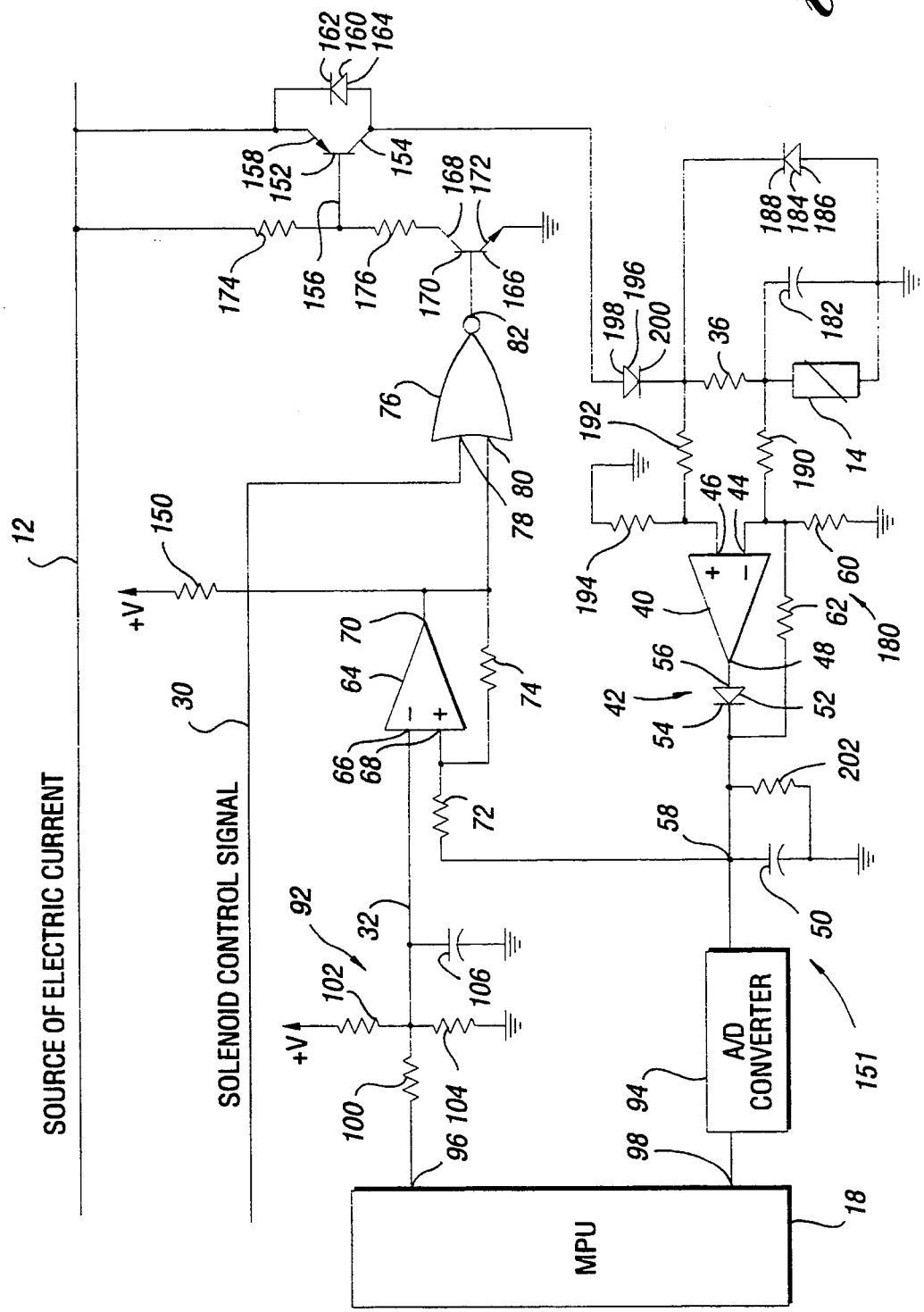

CURRENT LIMITING SOLENOID DRIVER

TECHNICAL FIELD

This invention relates to apparatus and methods for driving and limiting the current of electric solenoids.

BACKGROUND ART

Electric solenoids have been used in automotive applications for some time, and a variety of control systems have been designed to control their operating currents. One reason for the variety of control systems is the variation of system source voltages and solenoid characteristics. Automotive applications typically involve an interface of a computer operating at 5 volts to a solenoid powered by a 12-volt or 24-volt power supply. The resistance of each solenoid must be relatively low to ensure that, even with the lowest reasonable system voltage applied, adequate current is developed to effectively attract an associated armature.

If a relatively high system voltage is applied to a solenoid having a low resistance, however, a higher than required current is developed; and the solenoid is forced to dissipate the excess energy as heat. As an example, if the voltage applied to a solenoid having a resistance of 3 ohms varies between 7 and 30 volts, the power varies between 16 and 300 watts. Producing a solenoid that is simultaneously capable of being actuated by a low system voltage and capable of dissipating the excess energy generated by a high system voltage is difficult and costly, and the resulting solenoid is likely to be impractically large for many planned applications.

A common method of controlling current applied to a solenoid is that of using a linear control system. With a linear control system, however, a solenoid driver in the control system absorbs excess energy not required to drive the solenoid. A disadvantage of such a system is that it supplies more energy to the solenoid driver and to the solenoid than is needed, for example, with a switch-mode control system.

High-side solenoid drivers, that is, solenoid drivers disposed on the power supply side of a solenoid, are sometimes used in solenoid control systems. They require the attendant use of level shifting circuitry, however, which adds cost and complexity. As the circuitry becomes more sophisticated, the cost and complexity of associated interface circuitry also increases. Another disadvantage is the fact that semiconductors (for example, NPN bipolar transistors and N-channel field-effect transistors) used in control systems using low-side solenoid drivers are available in a wider selection with better characteristics at lower cost than are those used in high-side solenoid drivers.

While the foregoing function with a certain degree of efficiency when used in connection with the control of electric solenoids, they do not provide the advantages of the improved method and apparatus of the present invention as is hereinafter more fully described.

DISCLOSURE OF THE INVENTION

An object of the present invention is to provide an improved, relatively uncomplicated, relatively inexpensive, switch-mode, solenoid driver and method for accurately controlling current applied to an electric solenoid and to minimize power dissipated by the solenoid and its associated driver.

Another object of the present invention is to selectively limit current applied to a solenoid.

Still another object of the present invention is to provide an improved apparatus and method for accurately controlling current applied to one of a number of electric solenoids.

Yet another object of the present invention is to provide a solenoid driver capable of supplying an actuating current to a solenoid during the armature attracting phase and supplying a reduced holding current after the armature has been attracted.

A feature of the present invention is the protection provided the solenoid driver against damage resulting from being shorted to the source of electric current.

Another feature of the present invention is means provided for fault detection.

In realizing the aforementioned and other objects and features, a first embodiment of the present invention includes a low-side, switch-mode, solenoid driver for controlling electric current from a system power supply, or source of electric current, to actuate and hold actuated an electric solenoid. The current is applied in response to a solenoid control signal and with respect to a predetermined current reference signal. A switching transistor is used to rapidly switch current applied to the solenoid on and off to generate a pulsed current. Current is switched on until a signal representative of current flowing through the solenoid increases to an upper limit, whereupon it is switched off. The current remains off until the signal decreases to a lower limit, whereupon the current is again switched on. Solenoid inductance integrates the resulting pulsed current into a substantially steady-state current.

The solenoid driver also includes a detecting circuit for detecting current flow through the solenoid and generating in response thereto a peak signal representative of the amount of current flowing therethrough. The detecting circuit includes a current sensing resistor connected in series with the solenoid and the switching transistor. Since the sensing resistor is connected in series with the solenoid, the amount of voltage developed across the resistor is representative of the amount of current flowing through the solenoid.

The voltage developed across the sensing resistor is applied to a differential amplifier having a peak detector connected to its output to develop a peak signal representative of the peak current flowing through the solenoid. The peak signal is input, with the predetermined current reference signal, to a comparator; and a deviation signal is generated that is representative of the difference therebetween. The deviation signal is input, with the solenoid control signal, to a logical NOR gate; and a solenoid current control signal is generated that controls the switching transistor.

The present invention also includes a microprocessing unit, one function of which is to generate a current set point signal. A current set point circuit receives the current set point signal from an output of the microprocessing unit and generates in response thereto the current reference signal. An analog-to-digital converter is connected between the peak detector and an input of the microprocessing unit for converting the analog peak signal to a digital monitoring signal, representative of the amount of current flowing through the solenoid, to be used by the microprocessing unit to diagnose system faults and log errors to facilitate trouble shooting.

A second embodiment of the present invention includes a low-side, switch-mode, solenoid driver for controlling electric current from a system power supply, or source of electric current, to actuate and hold actuated one of a plurality of electric solenoids. The solenoid driver of the second embodiment functions in a manner that is similar to that of the first but additionally includes a set of Darlington amplifiers and associated circuitry for each solenoid. It also includes a logical NOR gate for each solenoid, each of the NOR gates being input with a separate solenoid control signal to select a specific one of the plurality of solenoids.

A third embodiment of the present invention includes a high-side, switch-mode, solenoid driver for controlling electric current from a system power supply, or source of electric current, to actuate and hold actuated an electric solenoid. The solenoid driver of the third embodiment principally differs from that of the first in that the switching transistor is disposed between the source of electric current and the solenoid, the solenoid driver therefore being referred to as a high-side solenoid driver. The solenoid driver functions in a manner similar to that of the first embodiment but additionally includes a current control transistor that receives the solenoid current control signal and controls the switching transistor in response thereto.

The objects and features described, and others of the present invention, are readily apparent from the following detailed description of the best mode for carrying out the invention when taken in connection with accompanying drawings.

BRIEF DESCRIPTION OF THE DRAWINGS

A more complete appreciation of the invention and many of the attendant advantages thereof may be readily obtained by reference to the following detailed description when considered with the accompanying drawings in which like reference characters indicate corresponding parts in all the views, wherein:

FIG. 9 is a schematic illustration depicting a high-side solenoid driver.

BEST MODE FOR CARRYING OUT THE INVENTION

Figure 1:
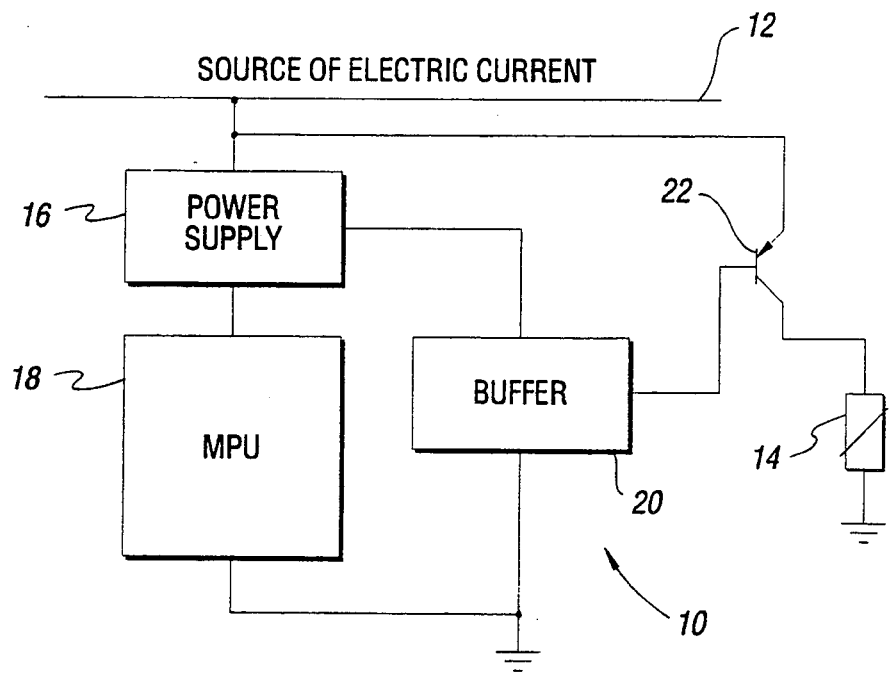
FIG. 1 is a schematic illustration of a simplified high-side solenoid driver.

Solenoid drivers may be divided into two general categories, high-side solenoid drivers and low-side solenoid drivers. A schematic illustration of a simplified high-side solenoid driver is shown by FIG. 1 of the drawings. A high-side solenoid driver, generally indicated by the reference numeral 10, is typically disposed between a system power supply, or source of electric current 12, and an associated solenoid 14 being controlled thereby. The high-side solenoid driver also includes a power supply 16, a microprocessing unit be, a buffer 20 and a switching transistor 22.

Figure 2:
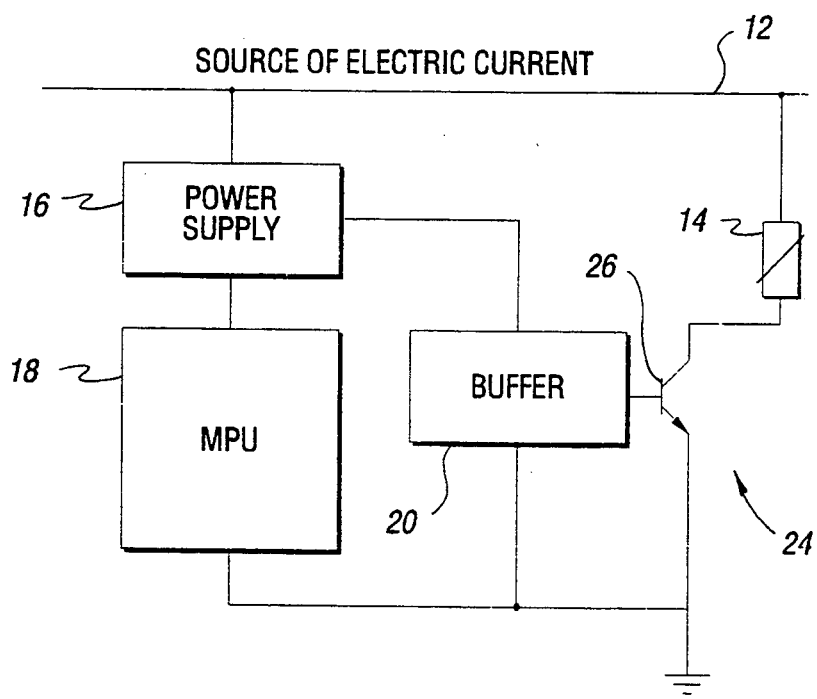
FIG. 2 is a schematic illustration of a simplified low-side solenoid driver.

A schematic illustration of a simplified low-side solenoid driver 10 is shown by FIG. 2 of the drawings. A low-side solenoid driver, generally indicated by the reference numeral 24, is typically disposed between a solenoid 14 being controlled thereby and ground. The low-side solenoid driver also includes a power supply 16, a microprocessing unit 18, a buffer 20 and a switching transistor 26. Low-side solenoid drivers offer the advantages of having available for use therein a wider selection of semiconductor devices with more desirable characteristics and at a lower cost than do high-side solenoid drivers. Advantage has been taken of these factors in the design of the solenoid drivers in the first two of three disclosed embodiments of the present invention.

A solenoid must be designed to have sufficient magnetomotive force, or ampere turns, to ensure the attraction of an associated armature. Once the armature has been attracted, however, magnetic reluctance within the magnetic circuit is reduced; and a lower current can be used to hold the armature in its attracted position. If a control circuit is used that reduces current flowing through the solenoid once its armature has been attracted, the amount of excess energy the solenoid must dissipate is also reduced; and the size, weight and cost of the solenoid can be reduced accordingly. Since the holding current is lower than the actuation current, the armature release time is shortened. The use of this type of control circuit can significantly improve the performance-versus-cost ratio of the solenoid and has been incorporated into the solenoid driver control circuit of the three embodiments of the present invention.

Although a common method of controlling current applied to a solenoid is that of using a linear control system, an associated solenoid driver in such a control system must absorb excess energy not required to drive the solenoid. This disadvantage can be overcome by using a switch-mode control system, which delivers pulses of current to the solenoid. In such a system, the inductance of the solenoid integrates the pulses into a substantially steady-state current. The use of such a system minimizes power applied to the solenoid and to the solenoid driver and has, accordingly, been used in the solenoid driver of the three disclosed embodiments of the present invention.

Figure 3:
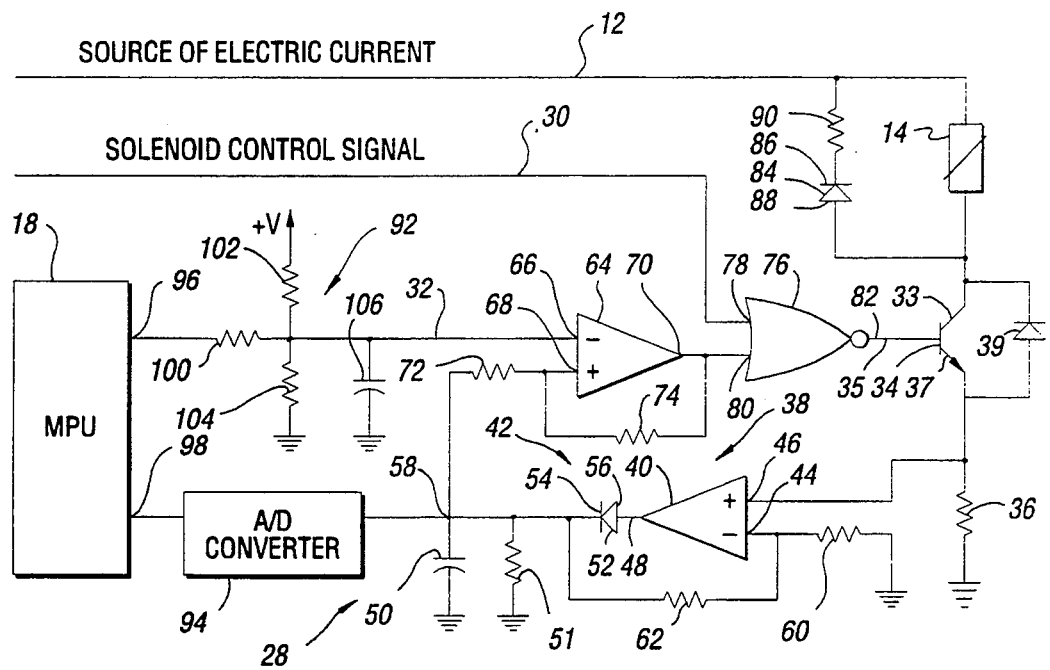
FIG. 3 is a schematic illustration depicting a low-side, switch-mode, solenoid driver for controlling electric current to actuate and hold actuated an electric solenoid.

The first disclosed embodiment of the present invention is illustrated by FIG. 3 of the drawings. Shown is a schematic depicting a low-side, switch-mode, solenoid driver, generally indicated by the reference numeral 28, for controlling electric current to actuate and hold actuated an electric solenoid 14. The control of current applied to the solenoid 14 is effectively a function of three factors, a solenoid control signal 30, a current reference signal 32 and current measured flowing through the solenoid 14. The solenoid control signal 30 indicates that the solenoid 14 is to be actuated. The current reference signal 32 provides a reference against which a signal representative of the actual current flowing through the solenoid 14 is compared, the circuit controlling the application of current to the solenoid being opened and closed as the current flowing through the solenoid 14 respectively exceeds and falls below predetermined limits.

A switching transistor 34, or switching means, having a collector 33 connected to the solenoid 14, a base 35 and an emitter 37 connected to ground through a current sensing resistor 36 is used to rapidly switch the current on and off, resulting in a pulsed current being applied to the solenoid 14. Solenoid inductance integrates the resulting pulsed current into a substantially steady-state current. A field decay protection diode 39 is connected between the collector 33 and the emitter 37 of the switching transistor 34 to provide protection therefor. The current reference signal 32 is set to provide sufficient current for a predetermined "pull-in" period to actuate the solenoid 14 and attract an associated armature (not shown). As previously mentioned, once the armature has been attracted, the magnetic reluctance of the solenoid 14 decreases; and the current required to hold the attracted armature in position also decreases. At this time, the current reference signal 32 is reduced to the level required to maintain the armature in its attracted position.

The current flowing through the solenoid 14 is monitored by measuring the voltage across a sensing resistor 36 connected in series with the solenoid 14 and the switching transistor 34. Since the sensing resistor 36 is in series with the solenoid 14, the amount of voltage developed across the sensing resistor 36 is representative of the amount of current flowing through the solenoid 14. The sensing resistor 36 is part of a detecting circuit, or detecting means, generally indicated by the reference numeral 38, that also includes a differential amplifier 40 and a peak detector, generally indicated by the reference numeral 42.

The differential amplifier 40 has an inverting input 44, a noninverting input 46 and an output 48. The peak detector 42 includes a peak detector capacitor 50, a peak detector bleed resistor 51 and a peak detector diode 52 having a cathode 54 and an anode 56. The anode 56 of the peak detector diode 52 is connected to the output 48 of the differential amplifier 40; and the peak detector capacitor 50 and the peak detector bleed resistor 51 are connected between the cathode 54 of the peak detector diode 52 and ground, the connection between the peak detector capacitor 50 and the cathode 54 of the peak detector diode 52 effectively being the output 58 of the peak detector 42.

The emitter 37 of the switching transistor 34 is also connected through a differential amplifier input resistor 47 to the noninverting input 46 of the differential amplifier 40, and a first differential amplifier gain resistor 60 is connected between the inverting input 44 of the differential amplifier 40 and ground. A second differential amplifier gain resistor 62 is connected between the inverting input 44 of the differential amplifier 40 and the cathode 54 of the peak detector diode 52.

The solenoid driver 28 could have been designed with the current sensing resistor 36 disposed in the collector circuit of the switching transistor 34 so that current would flow through the current sensing resistor 36 whether the switching transistor 34 is on or off. This would simplify the monitoring of solenoid current flow; but, since the voltage read across the current sensing resistor 36 would have to be level shifted, the differential amplifier 40 would have to be more complex and costly. In one potential solution to this problem, the voltage could be divided to reduce it to a level within an acceptable range of the differential amplifier 40 and then amplified; but this approach is complicated and expensive. Another potential solution would be to use a Norton amplifier; but, due to the variable characteristics of available amplifiers, this has not proved to be practical.

Placing the current sensing resistor 36 in the emitter circuit of the switching transistor 34, as shown by FIG. 3, would seem to be an ideal solution to the problem, but solenoid current would be sensed only when the switching transistor 34 is on, a false current level of zero being measured when the switching transistor 34 is off. By assigning proper values to associated components, however, the peak detector 42 can have a decay rate that mimics the decay rate of current in the solenoid 14.

The ratio of the resistances of the first and second differential amplifier gain resistors (60 and 62 respectively) determines the gain of the differential amplifier 40, and the absolute value of the resistances of the first and second differential amplifier gain resistors (60 and 62 respectively) determines the discharge rate of the peak detector capacitor 50. The discharge rate t is determined according to the following equation.

$$t = RC \approx L/R_L \tag{1}$$

where: is the peak detector discharge resistance
(In FIG. 3, $R = R_{62} + R_{60}$)
C is the peak detector capacitance
L is the solenoid inductance
$R_L$ is the resistance of the solenoid (plus flyback resistance, if applicable)

The amplifier gain $A_V$ is given by the following equation.

$$A_V = \frac{(R_{62} + R_{60})}{R_{60}} = 1 + \frac{R_{62}}{R_{60}} \tag{2}$$

A peak detector discharge resistor (not shown) may be placed across the peak detector capacitor; but, as shown in the circuit of FIG. 3, it may be eliminated by properly selecting the resistance values of the first and second differential amplifier gain resistors (60 and 62 respectively) according to equations (1) and (2).

The peak detector 42 additionally provides the solenoid driver 28 with protection against damage resulting from being shorted to the source of electric current 12. If the solenoid driver 28 should become shorted to the source of electric current 12, a current having an instantaneous level far exceeding that represented by the current reference signal 32 is forced through the current sensing resistor 36. Accordingly, the differential amplifier 40 pumps the output voltage of the peak detector 42 to a maximum.

The rise rate of current being driven through a normal inductive load is slowed as a function of the time constant of the load, the time constant being the ratio (L/R) of load inductance to resistance. An associated control circuit is therefore capable of maintaining the current within prescribed limits. Under short circuit conditions, however, the rise rate is nearly instantaneous; and associated control circuit components are incapable of responding rapidly enough to maintain the current within the limits. Under such conditions the current is limited only by the system voltage, or source of electrical current, the resistance of the current sense resistor 36 and the gain of the output device.

In the solenoid driver 28 of the first embodiment, once the control circuit does respond and the switching transistor 34 is switched off, it requires a significant amount of time for the peak detector to respond sufficiently for the switching transistor 34 to be switched on again. The current flow would have a predominantly low level punctuated by short spikes of high level current. Power dissipation by the solenoid driver 28 is thus minimal, and the latter is capable of withstanding a continuous short to the source of electric current.

To provide the short circuit protection described by the foregoing, a few requirements in addition to those defined by equation (1) must be satisfied. The peak detector 42 must have a range of operation substantially greater than normal. A typical example would include a solenoid driver 28 wherein a current of 1 ampere flowing through the current sensing resistor 36 would be represented by a voltage of 1 volt appearing at the output 58 of the peak detector 42. Similarly, an armature attracting, or pull-in, current of 2 amperes would be represented by a voltage of 2 volts. A short circuit would drive the output 58 of the peak detector 42 to a significantly higher level of 3.5 or 4 volts. A substantial amount of time would be required for the voltage to decay from this level to that of 1 or 2 volts, thus providing a low duty cycle during a short circuit. Another requirement to be satisfied includes keeping the impedance being driven by the differential amplifier 40 sufficiently high so that the differential amplifier 40 is capable of responding quickly.

Also included in the first disclosed embodiment is a comparator 64, or comparing means, having an inverting input 66, a noninverting input 68 and an output 70. A first comparator gain resistor 72 is connected between the noninverting input 68 of the comparator 64 and the output 58 of the peak detector 42. A second comparator gain resistor 74 is connected between the noninverting input 68 of the comparator 64 and the output 70 of the comparator 64. A logical NOR gate 76, or logical gating means, having a control input 78, a reference input 80 and an output 82 is also included. Its control input 78 receives the solenoid control signal 30, and its reference input 80 is connected to the output 70 of the comparator 64. The output 82 of the logical NOR gate 76 is connected to the base 35 of the switching transistor 34.

When the solenoid 14 is actuated, the resulting voltage developed across the current sensing resistor 36 is applied to the noninverting input 46 of the differential amplifier 40. The peak detector 42 connected to the output 48 of the differential amplifier 40 develops a peak signal representative of the peak current flowing through the solenoid 14. The peak signal is input to the noninverting input 68 of the comparator 64, the predetermined current reference signal 32 is input to the inverting input 66 thereof, and a deviation signal is generated that is representative of the difference therebetween. The deviation signal is input, with the solenoid control signal 30, to the logical NOR gate 76; and a solenoid current control signal is generated that is applied to and that controls the switching transistor 34. The solenoid current control signal switches the switching transistor 34 off when the solenoid current is determined to have exceeded a predetermined upper limit and switches the switching transistor 34 on, provided the solenoid control signal 30 is still present, when the solenoid current is determined to have fallen below a predetermined lower limit.

A flyback diode 84 is also included in the first disclosed embodiment. The flyback diode 84 is connected across the solenoid 14 to discharge the solenoid 14. The flyback diode 84 has a cathode 86 and an anode 88, the cathode 86 being connected to the source of electric current 12 through a flyback resistor 90 to enhance turn off properties of the circuit, the flyback resistor 90 allowing the solenoid 14 to discharge more rapidly than it charges.

The first disclosed embodiment also includes a microprocessing unit 18, a current set point circuit, generally indicated by the reference numeral 92, and an analog-to-digital converter 94. The current set point circuit 92 is connected between an output 96 of the microprocessing unit 18 and the inverting input 66 of the comparator 64, and the analog-to-digital converter 94 is connected between the output 58 of the peak detector 42 and an input 98 of the microprocessing unit 18.

The current set point circuit 92 includes a first set point resistor 100 connected between the output 96 of the microprocessing unit 18 and the inverting input 66 of the comparator 64, a second set point resistor 102 connected between the inverting input 66 of the comparator 64 and a positive source of voltage, a third set point resistor 104 connected between the inverting input 66 of the comparator 64 and ground, and a set point capacitor 106 connected between the inverting input 66 of the comparator 64 and ground.

One function of the microprocessing unit 18 is to generate a current set point signal. The latter has an initial amplitude that is maintained for a predetermined "pull-in" period, the amplitude then being reduced during a subsequent period. The current set point circuit 92 receives the current set point signal from the microprocessing unit 18 and generates in response thereto the current reference signal 32.

Figure 4:
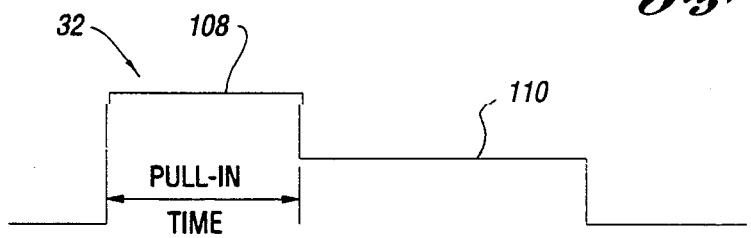
FIG. 4 is a graphic representation of a current reference signal.

FIG. 4 of the drawings is a graphic representation of the current reference signal 32, generally indicated by the reference numeral 32. Being responsive to the current set point signal, the current reference signal 32 has a corresponding initial amplitude, illustrated by an initial portion 108, such that solenoid current generated as a result thereof is capable of attracting the solenoid armature. The current reference signal 32 also has a corresponding reduced amplitude, illustrated by a subsequent portion 110, during the subsequent period such that the current applied to the solenoid is capable of maintaining the armature in its attracted position. The amplitude and duration of the initial portion 108 is representative of the armature attracting, or pull-in, current and is a function of system voltage.

Figure 5:
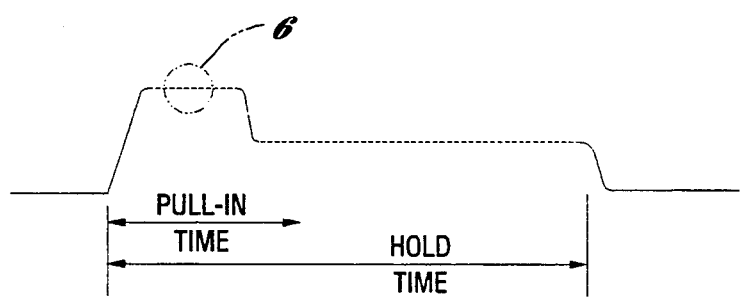
FIG. 5 is a graphic representation of a switch-mode current waveform.
Figures 6, 7:
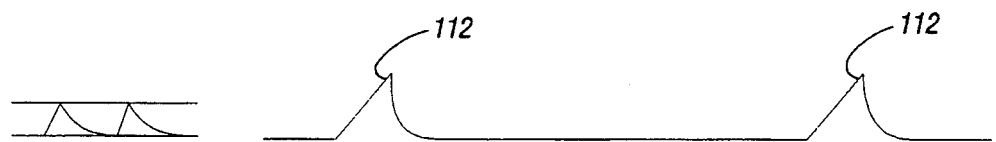
FIG. 6 is a graphic representation of a magnified portion of the switch-mode current waveform of FIG. 4.
FIG. 7 is a graphic representation of solenoid test pulses.

FIG. 5 of the drawings is a graphic representation of a typical switch-mode current waveform. Generally illustrated are the current levels flowing through the solenoid during the pull-in time, that is, the period during which the associated solenoid armature is being initially attracted, and during the hold time, that is, the period during which the armature is being held in its attracted position. FIG. 6 is a graphic representation of a magnified portion of the switch-mode current waveform of FIG. 5, the portion being indicated by a circle 6. The waveform shown by FIG. 6 reflects the solenoid current as it varies between its predetermined upper and lower limits. The period and amplitude of the solenoid current illustrated are a function of comparator hysteresis and circuit delays.

Another function of the microprocessing unit 18 (FIG. 3) is to provide means for monitoring solenoid current and to log any anomalies to facilitate the diagnosis of system problems. It is for this reason that the output 58 of the peak detector 42 is connected to the microprocessing unit 18 through the analog-to-digital converter 94. The analog-to-digital converter 94 converts the analog peak signal to a digital monitoring signal to be input to the microprocessing unit 18.

If a current is detected that is above a predetermined level, the anomaly can be logged; and, if desired, the solenoid driver 28 can be switched off. A current detected as being below a predetermined level might indicate that the solenoid 14 is disconnected or open or that an output pin is shorted to ground. Again, appropriate precautionary or maintenance action can be taken and the anomalies logged.

Antilock brake systems present a unique situation for the application of a solenoid driver since an associated solenoid is operated relatively infrequently. A method for testing a solenoid used in such an application includes applying a series of short test pulses 112, such as graphically represented by FIG. 7 of the drawings, to the solenoid. The width of the pulses ranges between ½ and 2 milliseconds, the period between pulses ranges between 60 and 100 milliseconds and the pulse amplitude ranges between 300 and 500 milliamperes. The signal aspects vary depending on the characteristics of the solenoid, but a typically preferred signal has a pulse width of 1 millisecond and an amplitude of 400 milliamperes, the period between pulses being 80 milliseconds.

At an intermediate point during the series of test pulses 112, the current sensed by the current sensing resistor 36 (FIG. 3) is measured. The pulses used for testing are too short to cause a response by the solenoid 14, typical response times of which range between 5 and 7 milliseconds. The pulses 112 are, however, long enough to generate a measurable current flowing through the solenoid 14; and the current measured must be within a predetermined range or an error is logged.

Figure 8:
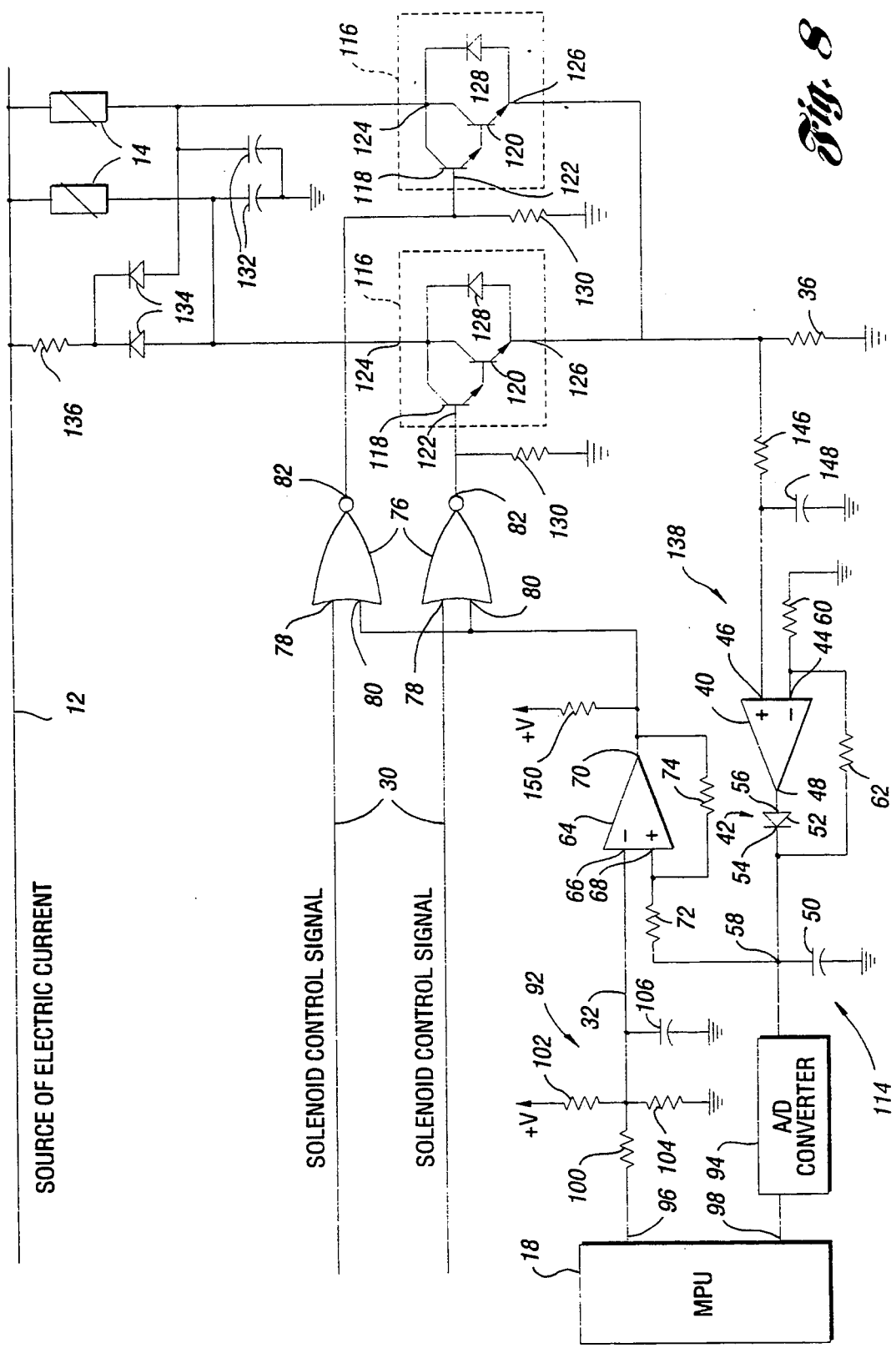
FIG. 8 is a schematic illustration depicting a low-side, switch-mode, solenoid driver for controlling electric current to actuate and hold actuated one of a plurality of electric solenoids.

The second disclosed embodiment of the present invention is illustrated by FIG. 8 of the drawings. Shown is a low-side, switch-mode, solenoid driver, generally indicated by the reference numeral 114, for controlling electric current to one of a number of electronic solenoids 14. The solenoid driver 114 is similar to that 28 of the first embodiment except that the logical gating means includes, for each solenoid 14, a logical NOR gate 76 and that the switching means includes, for each solenoid 14, a Darlington amplifier 116.

A Darlington amplifier is basically a transistor circuit including a driver transistor 118 and an output transistor 120 the collectors of which are connected together, the emitter of the driver transistor 118 being directly connected to the base of the output transistor 120 so that the emitter current of the driver transistor 118 equals the base current of the output transistor 120. The circuit effectively functions as a compound transistor having one base terminal 122, one collector terminal 124 and one emitter terminal 126. Each of the Darlington amplifiers 116 shown also includes a field decay protection diode 128 connected between the common collector and the emitter of the output transistor 120.

Each of the number of solenoids 14 is connected between the source of electric current 12 and the collector terminal 124 of its associated Darlington amplifier 116. A base resistor 130 is connected between the base terminal 122 of each Darlington amplifier 116 and ground, and a switching capacitor 132 is connected between the collector terminal 124 of each Darlington amplifier 116 and ground. The base terminal 122 of each Darlington amplifier 116 is also connected to the output 82 of one of the NOR gates 76. As in the first embodiment, a flyback diode 134 and a flyback resistor 136 are connected in series across each solenoid 14.

The detecting circuit, or detecting means, generally indicated by the reference numeral 138, is also similar to that 38 in the first embodiment except for the addition of an input resistor 146 connecting the noninverting input 46 of the differential amplifier 40 to the emitter terminal 126 of each of the Darlington amplifiers 116 and an input capacitor 148 connected between the noninverting input 46 of the differential amplifier 40 and ground. The comparator 64, or comparing means, of the second embodiment additionally includes a comparator output resistor 150 connected between the output 70 of the comparator 64 and a source of positive voltage.

A separate solenoid control signal 30 is input to each NOR gate 76 to select a particular solenoid 14. As in the first embodiment, the solenoid control signal 30 enables one half of the NOR gate 76 associated with the selected solenoid 14. With this signal 30 present, whenever the deviation signal generated by the comparator 64 indicates that the current flowing through the solenoid 14 is below a lower limit, the Darlington amplifier 116 associated with the selected solenoid 14 is switched to apply current to the solenoid 14.

When the current flowing through the selected solenoid 14 exceeds an upper limit, the Darlington amplifier 116 associated therewith is switched to interrupt the flow of current thereto. Other than selecting one of a number of solenoids 14 rather than only one possible solenoid 14, the operation of the solenoid driver 114 is similar to that 28 of the first embodiment.

The third disclosed embodiment of the present invention is illustrated by FIG. 9 of the drawings. It is similar to the solenoid driver 28 of the first embodiment in that it controls electric current from a system power supply, or source of electric current 12, to actuate and hold actuated an electric solenoid 14. It differs basically in being a high-side solenoid driver, generally indicated by the reference numeral 151, rather than a low-side solenoid driver. The low-side and the high-side solenoid drivers use many similar components but arrange a number of them somewhat differently. The primary difference is that the high-side solenoid driver is disposed between the source of electric current 12 and the solenoid 14 rather than being disposed between the solenoid 14 and ground, as is the case with a low-side solenoid driver.

The switching means of the high-side solenoid driver includes a switching transistor 152 having a collector 154, a base 156 and an emitter 158 and a switching diode 160 having a cathode 162 connected to the emitter 158 of the switching transistor 152 and to the source of electric current 12 and anode 164 connected to the collector 154 of the switching transistor 152. The switching means also includes a current control transistor 166 having a collector 168, a base 170 and an emitter 172.

A first switching resistor 174 is connected between the source of electric current 12 and the base 156 of the switching transistor 152, and a second switching resistor 176 is connected between the base 156 of the switching transistor 152 and the collector 168 of the current control transistor 166. The emitter 172 of the current control transistor 166 is connected to ground, and the base 170 thereof is connected to the output 82 of the NOR gate 76.

The detecting circuit, or detecting means, generally indicated by the reference numeral 180, is also similar to that 38 in the first embodiment except that the solenoid 14 is connected between the current sensing resistor 36 and ground. Additional components include a switching capacitor 182 connected across the solenoid 14, and a flyback diode 184 having a anode 186 connected to ground and a cathode 188 connected across the series circuit of the current sensing resistor 36 and the solenoid 14.

Also added are a fist input resistor 190 connected between the inverting input 44 of the differential amplifier 40 and the ungrounded end of the solenoid 14 and a second input resistor 192 connected between the noninverting input 46 of the differential amplifier 40 and the cathode 188 of the flyback diode 184. A third differential amplifier gain resistor 194 is also connected between the noninverting input 46 of the differential amplifier 40 and ground. The high-side solenoid driver 151 also includes an isolation diode 196 having an anode 198 connected to the collector 154 of the switching transistor 152 and a cathode 200 connected to the cathode 188 of the fly back diode 184.

As in the comparator 64, or comparing means, of the second embodiment, that 64 of the third embodiment additionally includes a comparator output resistor 150 connected between the output 70 of the comparator 64 and a source of positive voltage. The high-side solenoid driver 151 requires a true differential amplifier 40 using resistors having a precision of about 0.1 percent. Also, because the differential amplifier gain network is somewhat different a separate peak detector bleed resistor 202 is connected across the peak detector capacitor 50. The operation of he solenoid driver 151 is similar to that 28 of the first embodiment.

Although it is not shown, it should be understood that the high-side solenoid driver 151 of the third embodiment could readily be modified by one skilled in the art in a manner similar to that represented by the low-side solenoid driver 114 of the second embodiment to control the application of current to one of a number of solenoids 14.

While the best mode for carrying out the invention has been described in detail, those familiar with the art to which this invention relates will recognize various alternative designs and embodiments for practicing the invention as defined by the following claims.

What is claimed is:

1. An apparatus for controlling, in response to a solenoid control signal and with respect to a predetermined current reference signal, electric current from a source thereof to actuate and hold actuated an electric solenoid in a manner to prevent damage form a short circuit of the solenoid, the apparatus comprising:
    switching means for rapidly switching current applied to the solenoid on and off to generate a pulsed current, the switching means including at least one switching transistor having a collector, an emitter and a base, the solenoid being connected between the source of electric current and the collector of the switching transistor;
    detecting means for detecting current flow through the solenoid and generating in response thereto a peak signal representative of the amount of current flowing through the solenoid, the detecting means including a current sensing resistor connected between the emitter of the switching transistor and ground,
    a differential amplifier having an inverting input, a noninverting input and an output, the noninverting input thereof being connected to the emitter of the switching transistor, and
    peak detector having an input and an output, the input thereof being connected to the output of the differential amplifier, the peak detector having an impedance sufficiently high to enable the differential amplifier to respond quickly and being further constructed such that a voltage appearing at the peak detector output has a predetermined value when current through the solenoid is sufficient to hold the solenoid actuated, the voltage appearing at the peak detector output when a short circuit is present across the solenoid increasing rapidly to a sufficiently high value that the time required during a short circuit condition to allow the voltage preparing at the peak detector output to decay to a value allowing the switching transistor to switch on again is longer than the time the switching transistor is switched on, thus providing a duty cycle sufficiently low to prevent damage to the switching transistor;
    comparing means for comparing the peak signal with the predetermined current reference signal and generating a deviation signal representative of the difference therebetween; and
    logical gating means for gating the solenoid control signal with the deviation signal and generating a solenoid current control signal to switch the switching transistor off and on respectively when the peak signal reaches predetermined maximum and minimum levels.

2. The apparatus as defined by claim 1, further including:
    a microprocessing unit for generating a current set point signal having an initial amplitude for a predetermined period and a lower amplitude during a subsequent period, the solenoid being actuated during the predetermined period and being held actuated during the subsequent period;
    a current set point circuit for receiving the current set point signal from an output of the microprocessing unit and generating in response thereto the current reference signal, the latter signal having an initial amplitude corresponding to the amplitude of the current set point signal during the predetermined period and a lower amplitude corresponding to the amplitude of the current set point signal during the subsequent period; and
    an analog-to-digital converter connected between the output of the peak detector and an input of the microprocessing unit for converting the analog peak signal to a digital monitoring signal representative of the amount of current flowing through the solenoid.

3. The apparatus as defined by claim 2, wherein the current set point circuit includes:
    a first set point resistor connected between the output of the microprocessing unit and the comparing means;
    a second set point resistor connected between the comparing means and a positive source of voltage;
    a third set point resistor connected between the comparing means and ground; and a set point capacitor connected between the comparing means and ground, the current reference signal generated by the current set point circuit being a function of the electric current from the source thereof.

4. The apparatus as defined by claim 1, wherein the detection means further includes:
   a first differential amplifier gain resistor connected between the inverting input of the differential amplifier and ground; and
   a second differential amplifier gain resistor connected between the inverting input of the differential amplifier and the output of the peak detector.

5. The apparatus as defined by claim 4, wherein the peak detector includes:
   a peak detector diode having a cathode and an anode, the anode of the peak detector diode being connected to the output of the differential amplifier;
   a peak detector capacitor connected between the cathode of the peak detector diode and ground; and
   a peak detector bleed resistor connected between the cathode of the peak detector diode and ground.

6. The apparatus as defined by claim 5, wherein the comparing means includes a comparator having an inverting input, an noninverting input and an output, the inverting input thereof receiving the current reference signal.

7. The apparatus as defined by claim 6, wherein the comparing means further includes:
   a first comparator gain resistor connected between the noninverting input of the comparator and the output of the peak detector; and
   a second comparator gain resistor connected between the noninverting input of the comparator and the output of the comparator.

8. The apparatus as defined by claim 7, wherein the logical gating means includes a NOR gate having a first input, a second input and an output, the first input thereof receiving the solenoid control signal, the second input thereof being connected to the output of the comparator, the output thereof being connected to the base of the switching transistor.

9. The apparatus as defined by claim 8, further including a flyback diode connected across the solenoid, the flyback diode having a cathode and an anode, the cathode being connected to the source of electric current.

10. The apparatus as defined by claim 8, further including a flyback resistor connected in series with the flyback diode across the solenoid.

11. The apparatus as defined by claim 3, wherein the electric current actuates and holds actuated an electric solenoid selected from a plurality thereof by an associated solenoid control signal, wherein:
    the at least one switching transistor includes a pair of switching transistor connected in a Darlington amplifier configuration associated with each of the plurality of solenoids, each Darlington amplifier having base, collector and emitter terminals, each of the plurality of solenoids being connected between the source of electric current and the collector terminal of its associated Darlington amplifier;
    the detecting means is connected to the emitter terminal of each Darlington amplifier, a peak signal generated by the detecting means being representative of the amount of current flowing through the actuated solenoid; and
    the logical gating means includes a NOR gate associated with each of the plurality of solenoids, each NOR gate having a first input, a second input and an output, each first input thereof receiving a solenoid control signal when the associated one of the plurality of solenoids is to be actuated, each second input thereof being connected to the output of the comparator, each output thereof being connected to the base of the Darlington amplifier associated with the actuated solenoid.

12. The apparatus as defined by claim 11, further including a plurality of base resistors, a base resistor being connected between the base terminal of one of each of the Darlington amplifiers and ground.

13. The apparatus as defined by claim 12, further including a plurality of collector capacitors a collector capacitor being connected between the collector terminal of one of each of the Darlington amplifiers and ground.

14. The apparatus as defined by claim 13, wherein the detection means includes:
    a current sensing resistor connected between the emitter terminals of the Darlington amplifiers and ground;
    a differential amplifier having an inverting input, a noninverting input and an output, the noninverting input thereof being connected to the emitter terminals of the Darlington amplifiers; and
    a peak detector having an input and an output, the input thereof being connected to the output of the differential amplifier.

15. The apparatus as defined by claim 14, wherein the detection means further includes:
    an input resistor connected between the noninverting input of the differential amplifier and the emitter terminals of the Darlington amplifiers; and
    an input capacitor connected between the noninverting input of the differential amplifier and ground.

16. The apparatus as defined by claim 15, wherein the detection means further includes:
    a first differential amplifier gain resistor connected between the inverting input of the differential amplifier and ground; and
    a second differential amplifier gain resistor connected between the inverting input of the differential amplifier and the output of the peak detector.

17. The apparatus as defined by claim 16, wherein the peak detector includes:
    a peak detector diode having a cathode and an anode, the anode of the peak detector diode being connected to the output of the differential amplifier; and
    a peak detector capacitor connected between the cathode of the peak detector diode and ground.

18. The apparatus as defined by claim 17, wherein the comparing means includes a comparator having an inverting input, a noninverting input and an output, the inverting input thereof receiving the current reference signal.

19. The apparatus as defined by claim 18, wherein the comparing means further includes:
    a first comparator gain resistor connected between the noninverting input of the comparator and the output of the peak detector;
    a second comparator gain resistor connected between the noninverting input of the comparator and the output of the comparator; and a comparator output resistor connected between the output of the comparator and a source of positive voltage.

20. The apparatus as defined by claim 19, further including a flyback diode connected across each of the plurality of solenoids, the flyback diode having a cathode and an anode, the cathode being connected to the source of electric current.

21. The apparatus as defined by claim 20, further including a flyback resistor connected between the cathodes of all the flyback diodes and the source of electric current.

22. The apparatus as defined in claim 3, further including:
- a switching diode having a cathode connected to the emitter of the switching transistor and to the source of electric current and an anode connected to the collector of the switching transistor;
- a current control transistor having a collector, a base and an emitter, the emitter being connected to ground;
- a first switching resistor connected between the source of electric current and the base of the switching transistor; and
- a second switching resistor connected between the base of the switching transistor and the collector of the current control transistor.

23. The apparatus as defined by claim 22, wherein the electric solenoid has a grounded end connected to ground and an ungrounded end, the detection means including:
- an isolating diode having a cathode and an anode, the anode being connected to the collector of the switching transistor;
- a current sensing resistor connected between the cathode of the isolating diode and the ungrounded end of the solenoid;
- a differential amplifier having an inverting input, a noninverting input and an output;
- a first input resistor connected between the noninverting input of the differential amplifier and the cathode of the isolating diode;
- a second input resistor connected between the inverting input of the differential amplifier and the ungrounded end of the solenoid;
- a solenoid capacitor connected across the solenoid; and
- a peak detector having an input and an output, the input thereof being connected to the output of the differential amplifier.

24. The apparatus as defined by claim 23, wherein the detection means further includes:
- a first differential amplifier gain resistor connected between the inverting input of the differential amplifier and ground;
- a second differential amplifier gain resistor connected between the inverting input of the differential amplifier and the output of the peak detector; and
- a third differential amplifier gain resistor connected between the noninverting input of the differential amplifier and ground.

25. The apparatus as defined by claim 24, wherein the peak detector includes:
- a peak detector diode having a cathode and an anode, the anode of the peak detector diode being connected to the output of the differential amplifier;
- a peak detector capacitor connected between the cathode of the peak detector diode and ground; and
- a peak detector bleed resistor connected between the cathode of the peak detector diode and ground.

26. The apparatus as defined by claim 25, wherein the comparing means includes a comparator having an inverting input, a noninverting input and an output, the inverting input thereof receiving the current reference signal.

27. The apparatus as defined by claim 26, wherein the comparing means further includes:
- a first comparator gain resistor connected between the noninverting input of the comparator and the output of the peak detector;
- a second comparator gain resistor connected between the noninverting input of the comparator and the output of the comparator; and
- a comparator output resistor connected between the output of the comparator and a source of positive voltage.

28. The apparatus as defined by claim 27, wherein the logical gating means includes a NOR gate having a first input, a second input and an output, the first input thereof receiving the solenoid control signal, the second input thereof being connected to the output of the comparator, the output thereof being connected to the base of the current control transistor.

29. The apparatus as defined by claim 28, further including a flyback diode having a cathode connected tot he cathode of the isolating diode and an anode connected to ground.

* * * * *